United States Patent [19]

Kaji

[11] 4,013,940
[45] Mar. 22, 1977

[54] SEMICONDUCTOR CIRCUIT DEVICE
[75] Inventor: Isamu Kaji, Kyoto, Japan
[73] Assignee: Naoyuki Maeda, Inuyama, Japan
[22] Filed: Dec. 12, 1975
[21] Appl. No.: 640,391
[30] Foreign Application Priority Data
  Dec. 21, 1974  Japan .......................... 49-147241
[52] U.S. Cl. ............................ 323/22 T; 321/45 R
[51] Int. Cl.² .......................................... G05F 1/56
[58] Field of Search ................ 321/45 R; 323/22 T
[56] References Cited
  UNITED STATES PATENTS
  3,365,650  1/1968  Camp et al. ................. 321/45 R X
  3,706,925  12/1972  Engelhardt ................... 321/45 R X
  3,781,654  12/1973  Simcoe ......................... 323/22 T X Primary Examiner—William M. Shoop
Attorney, Agent, or Firm—Karl F. Ross; Herbert Dubno

[57] ABSTRACT

In a semiconductor circuit device of the Darlington type connection, the collector of a forward stage current amplifying transistor is of transistor connected to that point of the load of the succeeding stage power transistor which corresponds to an intermediate tap of the load.

5 Claims, 8 Drawing Figures

SEMICONDUCTOR CIRCUIT DEVICE

BACKGROUND OF THE INVENTION

In a conventional semiconductor circuit device for obtaining a large current amplifying factor, the D.C. current amplifying factor (or a pulse current amplifying factor) $h_{FE}$ of a transistor is generally about 50, and it is at most 150 in the case of extremely high current amplification. In a Darlington circuit, which is an amplifying circuit having a forward stage current amplifying transistor $Q_1$ whose emitter output is directly connected to the base of a succeeding stage power transistor $Q_2$, the net amplifying factor becomes the product of the direct current amplifying factors of the individual transistors $Q_1$ and $Q_2$. Thus, the overall amplifying factor of the Darlington connection is very large, but since it is a kind of an emitter follower connection (i.e., a connection from which the output is taken from the emitter of the forward stage current amplifying transistor), its input impedance is very large (e.g., several ten $K\Omega$ or larger). Accordingly, the conventional Darlington connection has a shortcoming in that the emitter current of the forward stage transistor $Q_1$ is small, and the overall direct current amplifying factor is smaller than what is theoretically expected.

In a known effort to mitigate this shortcoming, a resistor $R_1$ is inserted between the base and the emitter of the succeeding stage transistor $Q_2$, as shown by broken lines in FIG. 1, so as to increase the collector current of the transistor $Q_1$ for improving the gain. With this known circuit, however, when the load current is large, saturation of the collector current of the transistor $Q_2$ cannot be expected. Hence, temperature rise due to the collector loss of the transistor $Q_2$ becomes high, resulting in the disadvantage that the high temperature rise tends to cause transistor breakdown and that a large load output cannot be produced.

SUMMARY OF THE INVENTION

An object of the present invention is to provide a semiconductor circuit device with a Darlington transistor connection having a power transistor with a load connected thereto and a current amplifying transistor directly connected to the power transistor at an immediately forward stage thereof, wherein the power transistor is allowed to be fully saturated for minimizing the collector loss and temperature rise therein so as to produce a large output.

In the device according to the present invention, a part of load is connected between the collector of the forward stage current amplifying transistor and the collector of the succeeding stage power transistor, so as to apply different voltages to the two collectors, respectively.

Figure 2:
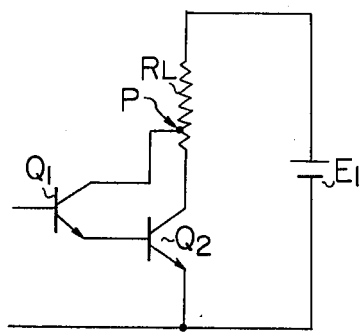
FIG. 2 is a circuit diagram of a Darlington connection according to the present invention.
Figure 3:
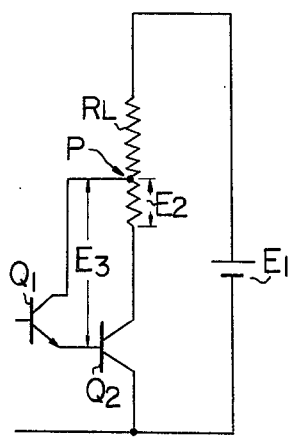
FIG. 3 is a diagram, illustrating the voltage distribution at the important points of the circuit of FIG. 2.
Figure 4:
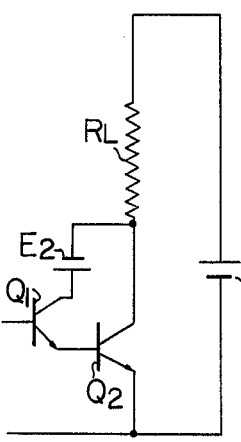
FIG. 4 is an electric equivalent circuit of the connection of FIG. 2.

DESCRIPTION OF THE PREFERRED EMBODIMENTS:

In FIG. 2, an intermediate tap P is provided on a load $R_L$, which load is connected in series with a power source $E_1$, at a position closer to the collector of a transistor $Q_2$. The position of the tap P is selected in such a manner that the tapped voltage $E_2$ from the load, as shown in FIG. 3, is higher than the saturated collector-emitter voltage $E_3$ of a forward stage transistor $Q_1$, so that, in effect, the voltage $E_2$ acts as an additional collector voltage to the transistor $Q_1$, as shown in FIG. 4. Accordingly, it is possible to cause a large base current to flow through the transistor $Q_2$ for fully saturating the transistor $Q_2$.

Figure 5:
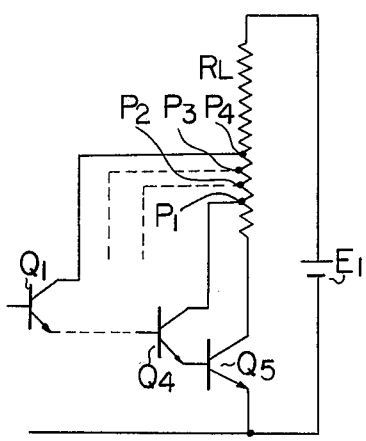
FIG. 5 is a circuit diagram of a multi-stage current amplifier according to the present invention.

In case of a multi-stage current amplifier, as shown in FIG. 5, a plurality of intermediate taps, e.g., $P_1$ through $P_4$, are provided in a load $R_L$ in proportion to the saturated voltages of forward stage current amplifying transistors, e.g., $Q_1$ through $Q_4$, respectively. The different taps $P_1$ through $P_4$ are connected to the collectors of the different transistors $Q_1$ through $Q_4$, respectively. Thus the transistors are allowed to be fully saturated, and a large load output can be effectively produced for a small input.

Although the load is described as a resistive load $R_L$ in the foregoing embodiments, other loads, such as inverter transformers and switching loads like ignition coils, can be used in the device of the present invention.

Figure 1:
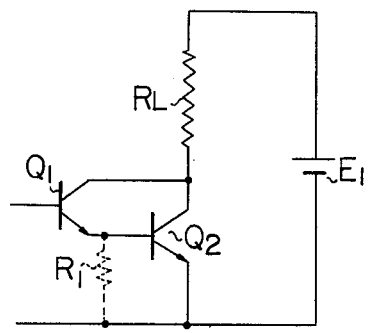
FIG. 1 is a circuit diagram of a conventional (prior art) Darlington connection.
Figure 6:
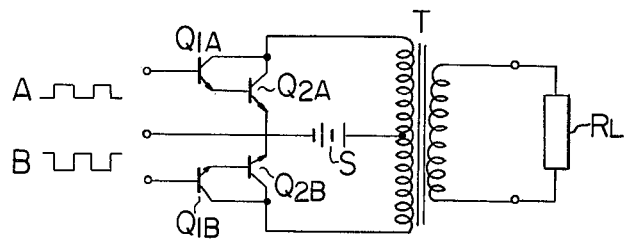
FIG. 6 is an electric circuit diagram of an inverter using a conventional Darlington circuit.

FIG. 6 shows an electric circuit of an inverter using a conventional (prior-art) Darlington connection of transistors. In the D.C.-A.C. converter (i.e., inverter) using a transistor switching circuit of conventional Darlington connection of FIG. 6, forward stage amplifying transistors $Q_{1A}$ and $Q_{1B}$ are driven by rectangular input signals A and B, respectively, so as to periodically turn on and turn off power transistors $Q_{2A}$ and $Q_{2B}$ in an alternate fashion. Accordingly, an A.C. current of rectangular waveform is produced across the secondary winding of a transformer T in response to currents from a D.C. power source S, which A.C. current is an output current applicable to a load $R_L$. This conventional Darlington connection has a shortcoming in that the saturation voltage of the power transistor is large (i.e., a large collector loss) for large load output, as explained hereinbefore by referring to FIG. 1, and the transistor is excessively heated and the converting efficiency of the inverter is poor.

Figure 7:
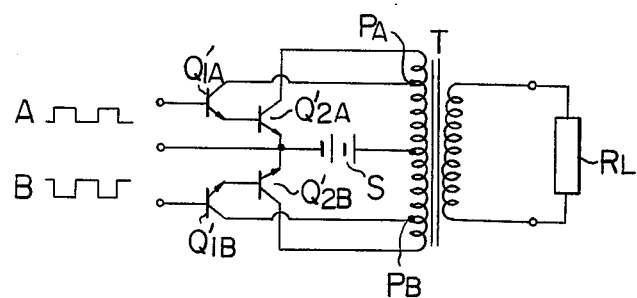
FIG. 7 is an electric circuit diagram of an inverter using a semiconductor circuit device according to the present invention.

FIG. 7 shows an electric circuit of another embodiment of the present invention, which is an inverter using a semi-conductor circuit device according to the present invention. In the inverter of FIG. 7, using a transistor switching with an improved Darlington circuit, forward amplifying transistors $Q_{1A}'$ and $Q_{1B}'$ alternately respond to rectangular input signals A and B and have their collectors connected to taps $P_A$ and $P_B$ on the primary winding of a transformer T, respectively, for driving power transistors $Q_{2A}'$ and $Q_{2B}'$. Accordingly, the output current to the load $R_L$ fully saturates the power transistors and fulfills the aforesaid effect of reducing the collector loss, as explained hereinbefore by referring to FIGS. 2, 3, and 4. Thus there is provided an inverter which has excellent characteristics having an improved converting efficiency in converting the power from D.C. power source S and ensuring good operation of transistor switching circuits.

Figure 8:
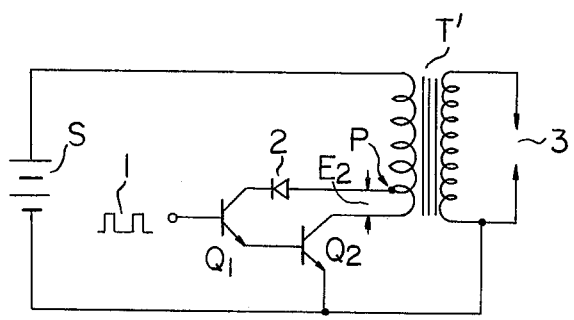
FIG. 8 is an electric circuit diagram of an electronic ignitor using a semiconductor circuit device according to the present invention.

FIG. 8 shows another embodiment of the present invention, which is an electronic ignitor for internal-combustion engines. In the ignitor, an intermediate tap P is provided in the primary winding of an ignition coil T' connected to the collector of a power transistor $Q_2$, which tap is positioned close to the collector of the transistor $Q_2$. The collector of a forward amplifying transistor $Q_1$ is connected to the tap P. When input pulse 1 carries an ON signal, the transistors $Q_1$ and $Q_2$ become conductive, and an electric current from a D.C. power source S flows through the primary winding of the ignition coil T'. The voltage drop across the primary winding due to the load current is used for producing an additional voltage $E_2$ to be applied to the transistor $Q_1$, which additional voltage is a division of the voltage drop between the collector of the transistor $Q_2$ and the tap P. Thus, the base current of the transistor $Q_2$ can become large, while the collector-emitter circuit of the transistor $Q_2$ can be fully saturated. Accordingly, the collector loss of the transistor $Q_2$ is reduced, and the current from the D.C. power source S can be efficiently applied to the primary winding of the ignition coil, so that the current interruption at the off-going time of the input pulse 1 induces a highvoltage pulse across the secondary winding of the ignition coil, for generating a high-energy spark discharge at the output 3.

In the embodiment of FIG. 8, the collector of the transistor $Q_1$ is connected to the tap P through a diode 2. This diode 2 is desirable for protecting the collector-emitter circuit of the transistor $Q_1$ and the base-collector circuit of the transistor $Q_2$ against inverse voltages.

Tests were made on the inverters, as shown in FIGS. 6 and 7, by measuring the collector currents of the forward stage amplifying transistors $Q_1$, the collector currents of the power transistors $Q_2$, the collector-emitter saturation voltages of the transistors $Q_2$, the collector losses of the transistors $Q_2$, and so on. The measuring method used and the measured values are as follows. For reference, the corresponding conventional values are shown, too.

| Measured Values Item | Conventional circuit | Circuit of the invention |
|---|---|---|
| $Q_1$ collector current, i.e., $Q_2$ base current | 0.26 A | 0.65 A |
| $Q_2$ collector current | 4.30 A | 4.18 A |
| $Q_2$ collector-emitter saturated voltage | 1.9 V | 1.1 V |
| $Q_2$ collector loss (Collector current was determined by measuring its instantaneous value when $Q_2$ was conductive.) | 15.4 W | 9.3 W |

As apparent from the above measured values, by connecting the collector of the transistor $Q_1$ to the tap of the load, the base current of the power transistor $Q_2$ is allowed to increase for enhancing the saturation of the transistor $Q_2$ and reducing the collector loss, and the increment of the $Q_2$ base current is added to a portion of the load (i.e., the circuit from the tap P to the power source) so as to increase the resultant load current for improving the efficiency. The measured values also indicate that the use of the semiconductor circuit device according to the present invention results in a reduction of the power transistor collector loss by about 39 percent, as compared with that with the conventional circuit, for producing the same output. Thus, it becomes possible to use transistors of smaller ratings.

I claim:

1. A semiconductor circuit device having a Darlington circuit including a power transistor connected to a load and a multiplicity of forward stage current amplifying transistors for driving subsequent current amplifying transistors and said power transistor, wherein plural intermediate taps are provided on said load connected to the collector of said power transistor and said current amplifying transistors having each of the collectors thereof connected to one of said taps, respectively.

2. A semiconductor circuit device specified in claim 1, wherein a diode is connected in a forward direction in the collector circuit of one of said current amplifying transistors.

3. A semiconductor circuit device specified in claim 1, wherein a diode is connected in a forward direction to the base of said power transistor.

4. A semiconductor circuit device having a Darlington circuit including a power transistor connected to a load and a forward stage current amplifying transistor for driving said power transistor, wherein said current amplifying transistor has it collector connected to a tap

| Measuring Method | |
|---|---|
| Power source voltage: | D.C. 12 volts |
| Input to $Q_1$ base: | 60 Hz rectangular wave (fixed input) |
| Output to transformer T: | 100 volts (connected to 100 W load) |
| Subject circuit: | Conventional, Fig. 6 The invention, Fig. 7 |
| Measurement of $Q_1$ collector current: | Mean value of readings on 0.5 class ammeters |
| Measurement of $Q_2$ collector current: | Mean value of readings on 0.5 class ammeters |
| Measurement of $Q_2$ collector-emitter saturation voltage: | By reading amplitude from synchroscope waveform when $Q_2$ is conductive |
| Tap portion on transformer primary windings: | Fourth turn from $Q_2$ collector, i.e., 15th turn from power source | of said load and a diode is connected in a forward direction in the collector circuit of said current amplifying transistor.

5. A semiconductor circuit device having a Darlington connection including a power transistor connected to a load having a tap and a forward stage current amplifying transistor for driving said power transistor, said current amplifying transistor having the collector thereof connected to said tap, a diode being connected in a forward direction to the base circuit of said power transistor.

* * * * *